US006867969B2

(12) United States Patent
Hwang

(10) Patent No.: US 6,867,969 B2
(45) Date of Patent: *Mar. 15, 2005

(54) SHIELDING CAGE ASSEMBLY ADAPTED FOR DENSE TRANSCEIVER MODULES

(75) Inventor: Jenq-Yih Hwang, Irvine, CA (US)

(73) Assignee: Hon Hai Precision Ind. Co., LTD, Taipei Hsien (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/622,954

(22) Filed: Jul. 18, 2003

(65) Prior Publication Data

US 2005/0013115 A1 Jan. 20, 2005

(51) Int. Cl.⁷ ................................................. H05K 7/20
(52) U.S. Cl. ....................... 361/690; 361/721; 361/742; 174/16.1; 174/35 R; 165/185
(58) Field of Search ................................. 361/683–690, 361/692, 715–721, 724–730, 816, 818; 174/35; 312/223.2; 211/41.17

(56) References Cited

U.S. PATENT DOCUMENTS

| | | | | |
|---|---|---|---|---|
| 4,752,861 A | * | 6/1988 | Niggl et al. | 361/692 |
| 5,673,171 A | * | 9/1997 | Varghese et al. | 361/685 |
| 6,349,041 B1 | * | 2/2002 | Hayward et al. | 361/818 |
| 6,498,728 B1 | * | 12/2002 | Sarno et al. | 361/752 |
| 6,558,191 B2 | * | 5/2003 | Bright et al. | 439/541.5 |

* cited by examiner

*Primary Examiner*—Boris Chervinsky
(74) *Attorney, Agent, or Firm*—Wei Te Chung

(57) ABSTRACT

A shielding cage assembly (10) for shielding a plurality of transceiver modules therein includes a conductive hanger (1), a conductive upper and a lower shielding cages (21, 22), and a spacer (3). A plurality of dividing walls (23, 25) inside the upper and lower shielding cages cooperatively define a plurality of channels for receiving the transceiver modules therein. The spacer is sandwiched between the stacked upper and lower shielding cages. The hanger encloses the shielding cages and the spacer therein and is fixed to a printed circuit board (4).

10 Claims, 6 Drawing Sheets

US 6,867,969 B2

SHIELDING CAGE ASSEMBLY ADAPTED FOR DENSE TRANSCEIVER MODULES

BACKGROUND OF THE INVENTION

1. Field of the Invention

This invention relates generally to a cage for shielding components from electromagnetic interference, and more particularly to a shielding cage assembly for arranging a plurality of transceiver modules therein. This application relates to a copending application Ser. No. 10/455,926 filed Jun. 6, 2003 and titled "2×4 SHIELDING CAGE ASSEMBLY ADAPTED FOR MULTIPLE TRANSCEIVER MODULES", and to a contemporaneously filed application having the same title as the instant invention. Both the copending and the contemporaneously filed applications have the same applicant and the same assignee as the instant application, and the contents of both these applications are incorporated herein by reference.

2. Description of the Related Art

A transceiver module is a discrete unit used in interface communication equipment, and is normally singly received in a cage that provides shielding against electromagnetic interference (EMI). Prior art shielded transceiver modules are too difficult to assemble densely to a circuit board. Therefore, an inexpensive shielding cage assembly that will allow transceiver modules to be easily and densely mounted on a circuit board is required.

Referring to FIG. 6, a prior art shielding cage assembly 100 for shielding a plurality of transceiver modules (not shown) therein includes a conductive body cage 101, a conductive cover cage 102 and a plurality of dividing walls 103, which cooperatively define a plurality of hollow spaces for receiving the transceiver modules therein. Retaining tabs 121, 311 are respectively formed on the body cage 101 and on the dividing walls 103, and engage in a corresponding plurality of slots 24a, 24 defined in the cover cage 102 to hold the cover cage 102 to the body cage 101 and to fix the dividing walls 103 between the cover cage 102 and body cage 101.

However, this kind of structure cannot satisfy the requirement to stackably mount transceiver modules in interface communication equipment. Therefore, an improved shielding cage assembly that is adapted for stackably receiving a plurality of transceiver modules therein is desired.

SUMMARY OF THE INVENTION

An object of the present invention is to provide a spacer for providing a controlled space between stacked levels of a shielding cage assembly.

A shielding cage assembly according to the present invention for shielding a plurality of transceiver modules therein includes a conductive hanger, a conductive upper and lower shielding cages, and a conductive spacer. A plurality of dividing walls, inside the upper and lower shielding cages cooperatively define a plurality of channels for receiving the transceiver modules therein. The spacer is sandwiched between the stacked upper and lower shielding cages. The hanger encloses the shielding cages and the spacer therein and is fixed to a printed circuit board.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
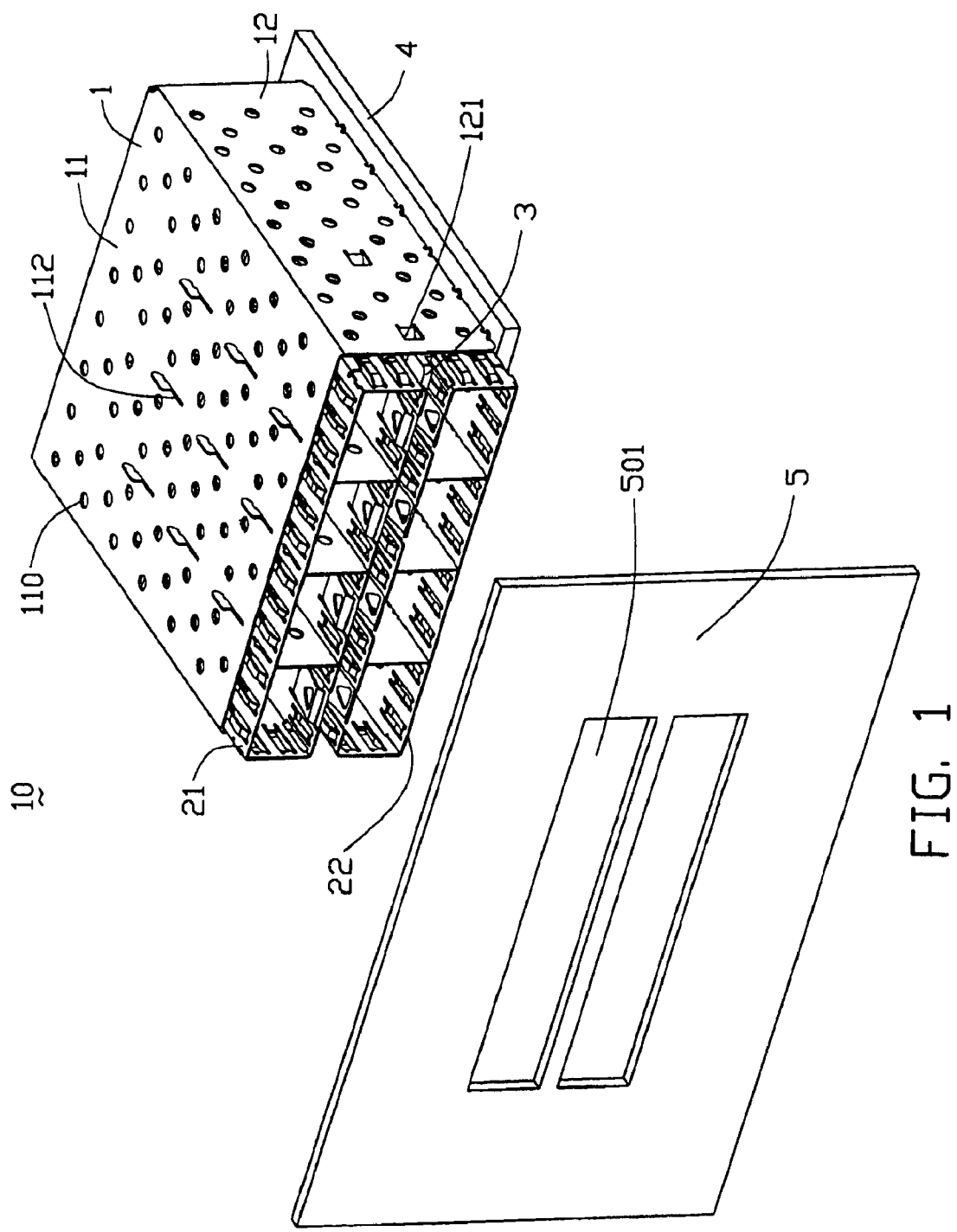
FIG. 1 is an assembled view of a shielding cage assembly in accordance with the present invention, mounted to a printed circuit board, with a panel prior to engagement therewith.

Referring to FIG. 1, a shielding cage assembly 10 in accordance with the present invention includes a metal hanger 1, an upper shielding cage 21, a lower shielding cage 22 and a spacer 3. The hanger 1 covers the upper and lower shielding cages 21, 22 and the spacer 3.

Figure 2:
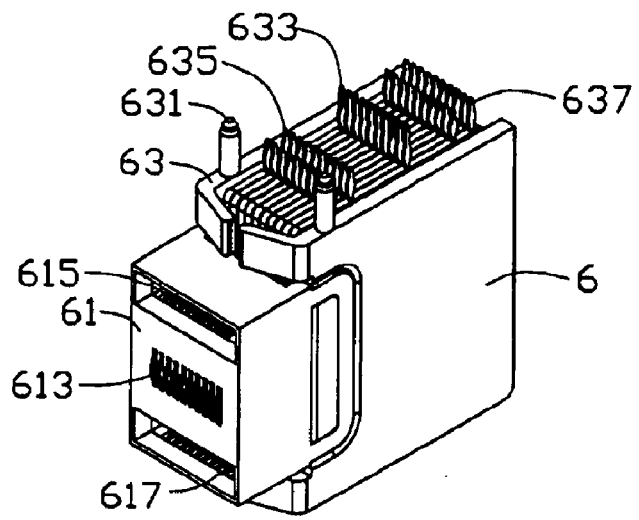
FIG. 2 is a bottom aspect view of the shielding cage assembly of FIG. 1.
Figure 2:
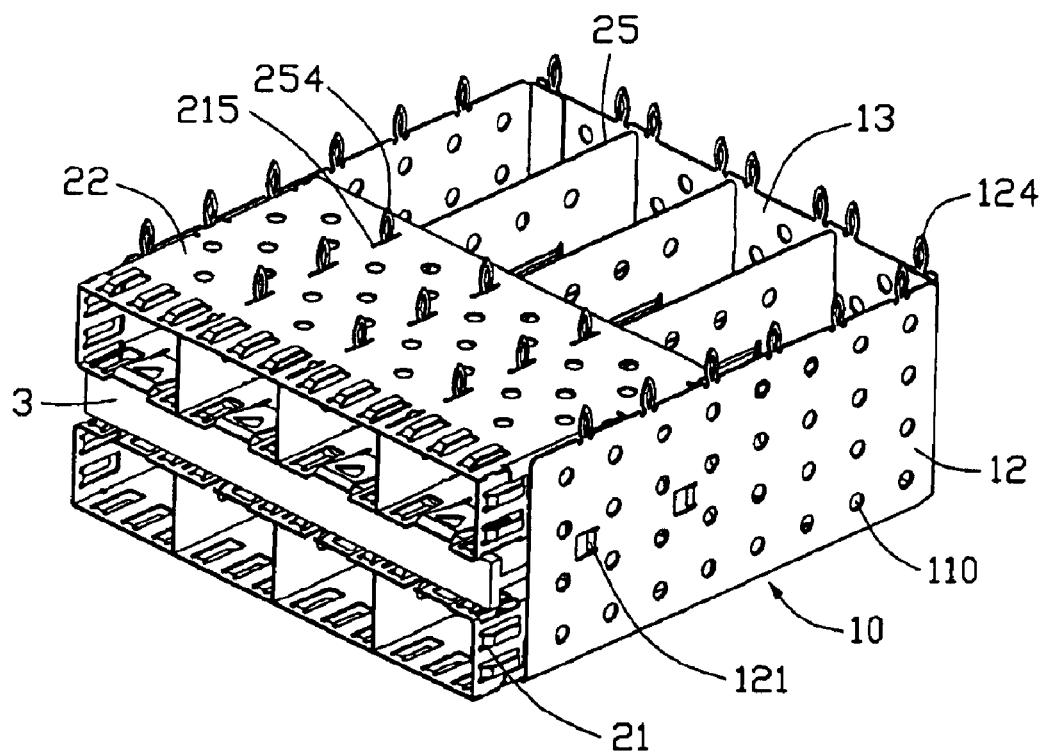

Referring also to FIG. 2, the hanger or cover 1 is formed from a single sheet of metal and is pressed into a rectangular receptacle box, which includes a top wall 11, two side walls 12 extending downwardly therefrom and a rear wall 13 extending between the two side walls 12. An opening (not labeled) is formed by the top and side walls 11, 12, which opening has a rearward boundary at the rear wall 13. A plurality of mounting pins 124 with needle-eyes therethrough respectively extends downwardly from the side and rear walls 12, 13. A plurality of slits 112 is defined through the top wall 11, arranged in parallel lines in a frontward to rearward direction. A pair of inward tabs 121 extends inwardly from each side wall 12 to engage with the spacer 3, which is received in the hanger 1, to help support a weight of the upper and lower shielding cages 21, 22 mounted thereto. A plurality of through holes 110 is defined through all walls 11, 12, 13 of the hanger 1 for dissipation of heat generated in transceiver modules received in the shielding cage assembly 10.

Figure 3:
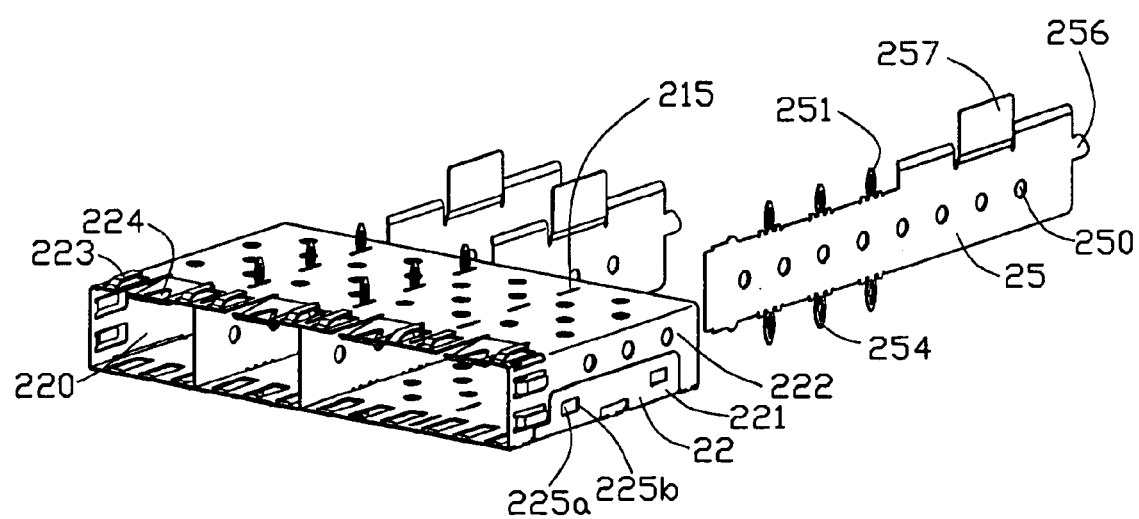
FIG. 3 is a perspective view of a lower shielding cage of the shielding cage assembly of FIG. 1, wherein a lower dividing wall is removed.

Referring to FIGS. 1 to 3, the lower shielding cage 22 includes a conductive first portion 221 and a conductive second portion 222. The first portion 221 covers the second portion 222. The side walls of the first and second portions 221, 222 are interlocking. A pair of retaining tabs 225a formed in each side of the second portion 222 is received in a pair of receiving slots 225b defined in each side of the first portion 221 for hand soldering together side walls of the first and second portions on both sides. A plurality of notches 215 is defined through the second portion 222 and the first portion 221 arranged in parallel lines in a frontward to rearward direction. A plurality of ground tabs 223 is formed near an opening 220 of the lower shielding cage 22 for making a grounding contact with sides of an aperture 501 of a panel 5 of a system assembly (not shown). A plurality of releasing tabs 224 extends inwardly at an angle from the second portion 222 into the opening 220. Each releasing tab 224 defines a triangular shaped opening (not labeled) therethrough for securing a transceiver module therein. The releasing tab 224 can be pushed upwardly to remove the transceiver module from the shielding cage assembly 10.

A plurality of conductive lower dividing walls 25 is inserted in the lower shielding cage 22 and divides an inner space of the lower shielding cage 22 into a plurality of channels (for example, FIG. 1 shows a 2×4 format shielding cage assembly having four channels per shielding cage 21, 22). Each channel receives a transceiver module therein. Each lower dividing wall 25 is elongated, and includes a plurality of mounting pins 251 extending upwardly from an upper, forward edge thereof and a plurality of mounting pins 254 extending downwardly from a lower, forward edge thereof. Each mounting pin 251, 254 defines a needle eye therethrough. A protrusion 257 extends from an upper, rearward edge of the dividing wall 25. A back tab 256 extends rearwardly from an end of the dividing wall 25. A plurality of through holes 250 is defined through the dividing wall 25 for good air ventilation. The mounting pins 251 pass through the corresponding notches 215 of the second portion 222, and the mounting pins 254 pass through the corresponding notches 215 of the first portion 221.

Figure 5:
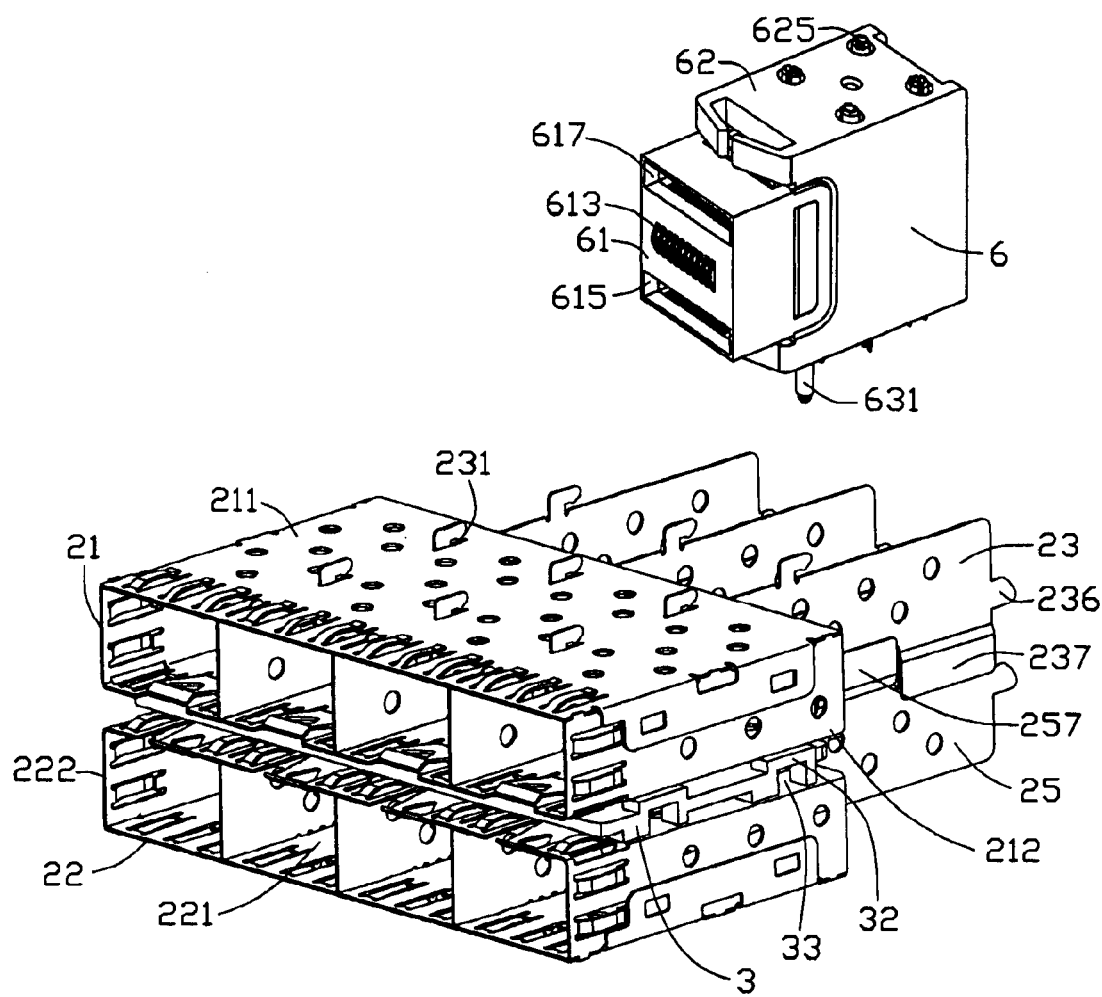
FIG. 5 is a perspective view of the shielding cage assembly of FIG. 1, wherein a hanger is removed.
Figure 6:
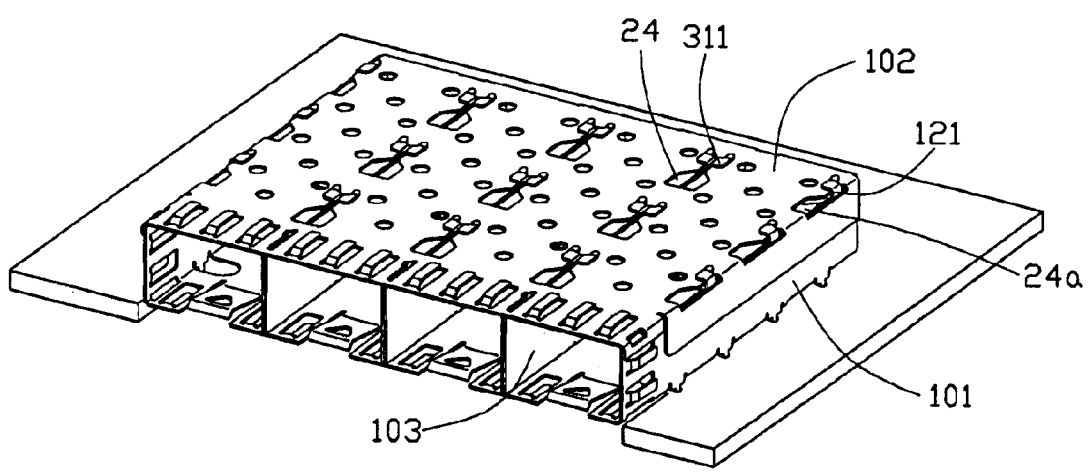
FIG. 6 is a perspective view of a shielding cage assembly according to the prior art.

Referring also to FIG. 5, the conductive upper shielding cage 21 is substantially similar to the lower shielding cage 22 in structure. A plurality of conductive upper dividing walls 23 is received in the upper shielding cage 21. The upper dividing walls 23 are similar to the lower dividing walls 25 received in the lower shielding cage 22, one difference being a plurality of retaining tabs 231 being formed on an upper edge of each upper dividing wall 23 in place of the mounting pins 251 of each lower dividing wall 25. The retaining tabs 231 pass through notches (not labeled) of a first portion 211. Similarly, a plurality of mounting pins (not shown) formed on a lower edge of the upper dividing wall 23 and similar to the mounting pins 254 of the lower dividing wall 25 pass through corresponding notches (not shown) defined in a second portion 212, said notches being similar to the notches 215 in the lower shielding cage 22. A back tab 236 is similar to the back tab 256 of the lower dividing wall 25. A protrusion 237 extends from a lower, rearward edge of the user dividing wall 23.

Figure 4:
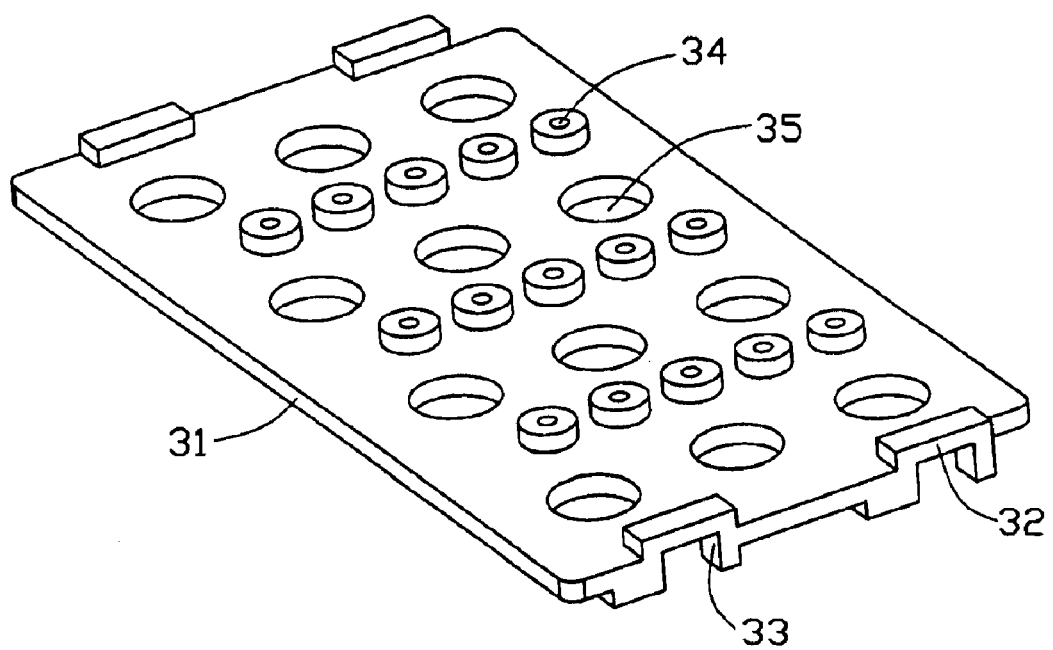
FIG. 4 is a perspective view of a spacer of the shielding cage assembly of FIG. 1.

Referring to FIG. 4, the spacer 3 is die-cast and is made of a lightweight material, such as aluminum alloy, zinc alloy, or plastic coated with a conductive material. This kind of spacer 3 has good electrical and thermal conductivities for EMI continuity and heat dissipation. The spacer 3 includes a rectangular base 31 and has a pair of bulges 32 extending from each of two opposite sides of the base 31, wherein each bulge 32 defines a recess 33 at a bottom of the base 31. A plurality of extending posts (not labeled), each defining a press-fit hole 34 therethrough, is formed on the base 31 arranged in lines for receiving the mounting pins of the upper dividing wall 23 and the mounting pins 251 of the lower dividing walls 25 therein. A plurality of venting holes 35 is defined through the base 31. This structure of the spacer 3 allows air to flow freely in all directions around the spacer 3. A front edge (not labeled) of the spacer 3 provides a stop feature when the shielding cage assembly 10 is inserted in the apertures 501 of the panel 5 of the system assembly.

Referring to FIGS. 2 and 5, a two-port electrical connector 6 is positioned to a rear of each pair of stacked channels of the shielding cage assembly 10. Each electrical connector 6 includes a front interface 61, a top surface 62 and a bottom surface 63. The front interface 61 has two signal ports 615, 617, each with a plurality of signal contacts 635, 637 therein for electrical connection with two transceiver modules respectively received in the lower and upper shielding cages 22, 21. Signals transmitted from the two transceiver modules are respectively delivered to a printed circuit board 4 (shown in FIG. 1) through the plurality of signal contacts 635, 637 of the signal ports 615 and 617, wherein the plurality of signal contacts extends from the bottom surface 63 of the electrical connector 6. A plurality of arch pins 613 protrudes from the front interface 61 and extends out from the bottom surface 63 as ground contacts 633 grounding with the printed circuit board 4. The arch pins 613 are for contacting with the spacer 3. A plurality of positioning pins 631 extends from the bottom surface 63 for positioning the electrical connector 6 on the printed circuit board 4. A plurality of inward pins 625 extends upwardly from the top surface 62. The inward pins 625 are made of elastic material.

In assembly, the retaining tabs 231 or mounting pins of the upper dividing wall 23 and mounting pins 251, 254 of the dividing walls 25 are respectively inserted into the first or second portions of the upper and lower shielding cages 21, 22, and the corresponding second or first portions of the shielding cages 21, 22 are assembled thereto to create completely assembled upper and lower shielding cages 21, 22. The second portion 222 of the lower shielding cage 22 is oriented upwardly, and the spacer 3 is mounted thereonto, the bulges 32 of the spacer 3 being positioned away from the second portion 222, and the mounting pins 251 of the lower dividing walls 25 being inserted into the press-fit holes 34 of the spacer 3. The upper shielding cage 21 fits to the spacer 3, whereinherein, the mounting pins of the upper dividing wall 23 go into the press-fit holes 34 of the spacer 3. The protrusions 237, 257 of the dividing walls 23, 25 come in complementary pairs. Thus, the upper shielding cage 21 and lower shielding cage 22 are stacked belly-to-belly, and the spacer 3 is sandwiched therebetween for providing good air ventilation. The hanger 1 encloses the upper and lower shielding cages 21, 22, with the retaining tabs 231 of the upper shielding cage 21 passing through corresponding slits 112 and hooking onto the hanger 1 for mechanical support and electrical grounding. Each channel formed inside the upper and lower shielding cages 21, 22 is used to receive a transceiver module. The electrical connectors 6 are received inside the metal hanger 1 between the dividing walls 23, 25 and side walls 12 to a rear of the channels. The inward pins 625 of the electrical connectors 6 are deformed inwardly and pass through the corresponding through holes 110 of the hanger 1. The bottom surface 63 of each electrical connector 6 is exposed from the hanger 1. The inward tabs 121 of the side walls 12 of the hanger 1 are inserted into the recesses 33 of the spacer 3, locking the spacer 3 in the hanger 1. The back tabs 236, 256 of the upper and lower dividing walls 23, 25 protrude out of the rear wall 13 of the hanger 1 and are bent at an angle for mechanical retention to and electrical continuity with the hanger 1 for EMI shielding. The mounting pins 124 of the hanger 1 and the mounting pins 254 of the lower dividing walls 25 are pressed into mounting holes (not shown) of the printed circuit board 4 for retaining and grounding, where they can be soldered or otherwise fixed therein. The positioning pins 631 of the electrical connectors 6 are inserted into positioning holes (not shown) of the printed circuit board 4, and the signal contacts 635, 637 and the ground contacts 633 are respectively received into corresponding holes (not shown) of the printed circuit board 4 for transmitting signals or electrical grounding. An assembly of the shielding cage assembly 10, the electrical connectors 6, and the printed circuit board 4 is thus completed.

The spacer 3 of the present invention has a complex geometry which allows air to flow freely in all directions around the spacer 3 for facilitating the dissipation of heat from a dense assembly of transceiver modules received in the shielding cage assembly 10. A thickness of the spacer 3 can be easily adjusted for accommodating different spacing applications.

Although the present invention has been described with specific terms, it should be noted that the described embodiments are not necessarily exclusive, and that various changes and modifications may be made thereto without departing from the scope of the present invention as defined in the appended claims.

What is claimed is:

1. A spacer for providing a space between stacked rows of transceiver module shielding cages, comprising:

a base having at least a hole for allowing air to follow therethrough and at least one conductive passageway defined therethrough for providing electrical and thermal conductivity between the rows of shielding cages.

2. The spacer as described in claim 1, wherein a plurality of venting holes is defined through the base for good air ventilation.

3. The spacer as described in claim 1, wherein the at least one conductive passageway comprises a plurality of posts each defining a press-fit hole therein.

4. The spacer as described in claim 1, wherein the spacer is made of a lightweight, electrically and thermally conductive material.

5. The spacer as described in claim 4, wherein the material is aluminum.

6. The spacer as described in claim 1, wherein the spacer is die-cast.

7. The spacer as described in claim 1, wherein a plurality of protrusions extends from the base for benefiting air flow.

8. A shielding cage assembly comprising:

a printed circuit board;

a shielding cover mounted onto the printed circuit board and cooperating with the printed circuit board to define therebetween a cavity extending in a front-to-back direction;

upper and lower conductive cages stacked, via a spacer therebetween, with each other in said cavity under said shielding cover;

at least a lower dividing wall located in the lower cage; and at least an upper dividing wall located in the upper cage in alignment with said at least one lower dividing wall in a vertical direction perpendicular to said front-to-back direction;

said upper cage and said lower cage being shorter than said at least one upper dividing wall and said at least one lower dividing wall in said front-to-back direction, wherein at least one of said at least one upper dividing wall and said at least one lower dividing wall includes a vertical protrusion extending toward the other and mechanically and electrically engaged with the other for shielding and grounding.

9. The assembly as claimed in claim 8, wherein said cover substantially has a same dimension with said at least one upper dividing wall and said at least one lower dividing wall in said front-to-back direction so as to fully cover said at least one upper dividing wall and said at least one lower dividing wall vertically.

10. A shielding cage assembly comprising:

a printed circuit board;

a shielding cover mounted onto the printed circuit board and cooperating with the printed circuit board to define therebetween a cavity extending in a front-to-back direction;

upper and lower conductive cages stacked, via a conductive spacer therebetween, with each other in the cavity under the shielding cover;

the upper cage and the lower cage being shorter than the shielding cover in said front-to-back direction; and an electrical connector located in the cavity under the shielding cover and behind the upper and lower cages; wherein said electrical connector defines upper and lower mating ports in respective alignment with the corresponding upper and lower cages in said front-to-back direction, and further includes conductive elements located between said upper and lower mating ports and mechanically and electrically engaged with the spacer.

* * * * *